United States Patent [19]

Beauducel et al.

[11] Patent Number: 4,801,838

[45] Date of Patent: Jan. 31, 1989

[54] METHOD AND DEVICE FOR IMPROVING THE SENSITIVITY AND THE SIGNAL TO NOISE RATIO OF PIEZO-ELECTRIC TRANSDUCERS HAVING A PLURALITY OF SENSORS COMBINED IN PARALLEL

[75] Inventors: Claude Beauducel, Henonville; Thierry Gautier, Melun, both of France

[73] Assignee: Institut Francais du Petrole, Rueil-Malmaison, France

[21] Appl. No.: 64,570

[22] Filed: Jun. 22, 1987

[30] Foreign Application Priority Data

Jun. 23, 1986 [FR] France .................. 86 09170

[51] Int. Cl.[4] ............................................. H01L 41/08
[52] U.S. Cl. .................................... 310/319; 310/329; 73/517 R
[58] Field of Search ............... 310/316, 319, 329, 338, 310/334–337; 73/517 R, 517 A; 367/7, 117, 135, 155, 157, 180, 901

[56] References Cited

U.S. PATENT DOCUMENTS

| | | | |
|---|---|---|---|
| 2,849,075 | 8/1958 | Godbey | 310/319 X |
| 4,072,936 | 2/1978 | Sprig | 310/319 X |
| 4,328,441 | 5/1982 | Kroeger, Jr. et al. | 310/319 |
| 4,643,028 | 2/1987 | Kondo et al. | 310/319 X |

Primary Examiner—Mark O. Budd
Attorney, Agent, or Firm—Antonelli, Terry & Wands

[57] ABSTRACT

A method and device are provided for improving the sensitivity and signal to noise ratio of transducers including several piezo-electric sensors interconnected in parallel to the input of an electric charge amplifier, said process consisting essentially in reducing the electric capacity of the combination of parallel sensors at the input of the amplifier so as to reduce the amplification gain applied to the noise without changing that which is applied to the signals picked up. This operation is achieved by means of an impedance transformer or else by means of at least one charge transfer capacitor connected by at least one switch alternately to the sensors and to the capacitor of the amplifier.

5 Claims, 2 Drawing Sheets

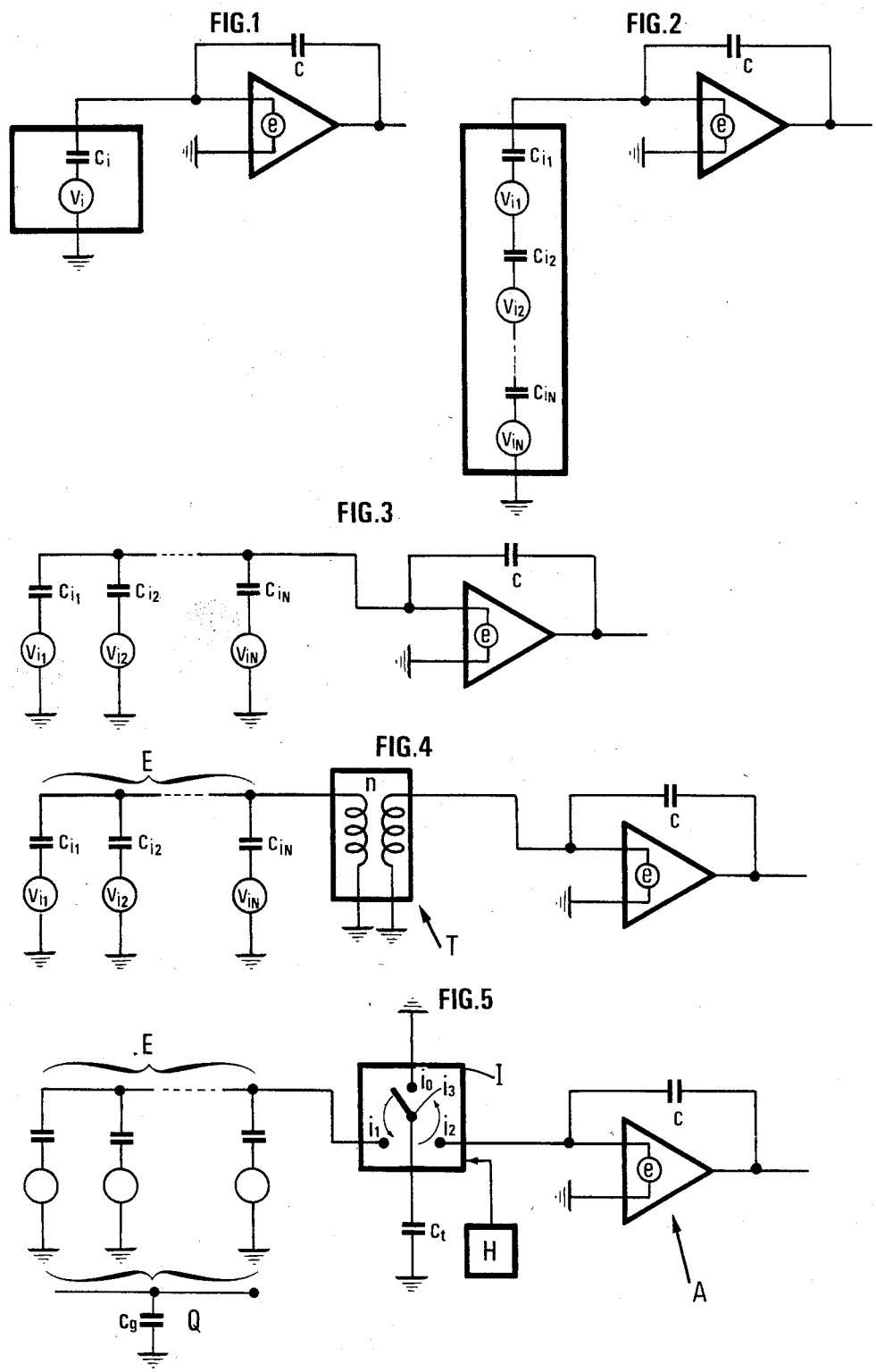

METHOD AND DEVICE FOR IMPROVING THE SENSITIVITY AND THE SIGNAL TO NOISE RATIO OF PIEZO-ELECTRIC TRANSDUCERS HAVING A PLURALITY OF SENSORS COMBINED IN PARALLEL

BACKGROUND OF THE INVENTION

1. Field of the Invention

The invention relates to a method for improving the sensitivity and signal to noise ratio of piezo-electric transducers including a plurality of parallel combined sensors.

In the field of seismic prospection, reception devices are generally used often formed of a high number of seismic receivers disposed at a distance from each other and connected to a central recording laboratory. Each receiver includes an elementary sensor or several sensors interconnected in series and/or in parallel for increasing their voltage or load sensitivity respectively.

For sea applications, the receivers are disposed along a sealed sheath or seismic streamer towed immersed by a ship. The sensors generally used are of the piezoelectric type. They includes disks of relatively small dimensions made from a piezo-electric material and are each associated with a pair of electrodes. Those disks are contained in cases having one or more faces transparent to the acoustic wave.

The assembly of cases contained in a reception device is generally divided into a plurality of receivers, each of them including a plurality of cases spaced apart from each other.

The combination of the electric signals delivered by a relatively large number of sensors (20 to 30 for example) spaced apart at even intervals (of the order of 1 m for example) forms wavenumber sampling and, by processing, a part of the background noise is filtered.

It is a question of noise whose wavenumber is less than 500 cycles/km (seismic "firing" noise between 10 c/km and 20 c/km, acoustic noise etc).

For the noises whose wavenumbers are higher, particularly flow noises related to the advance of the ship, and to the eddies about the seismic streamer, filtering by processing is impossible because of the "aliasing" of the frequency spectrum (Shannon's theorem).

To reduce these noises, in particular those whose wavenumber is greater than 5000 c/km, which corresponds to reduction of a wavelength less than 0.2 m, the hydrodynamic drag of the streamer may be considered. But the most efficient solution consists in providing a continuous sensor whose length is greater than the greatest wavelength of the noises to be filtered, that is to say at least equal to 0.2 m in the example considered.

2. Description of the Prior Art

From U.S. Pat. No. 3,798,474, a sensor device is known formed of at least one sensitive element including a combination of a flexible ribbon made from piezoelectric material and two electrodes disposed on each end of the ribbon, and more generally from several sensitive elements interconnected in series for example, so as to increase the sensitivity of the whole.

The sensors of this type generally have a fairly low sensitivity, which leads to combining them.

As will be seen in greater detail in the description, the combination of elementary sensors each formed of a sensitive piezoelectric element associated with electrodes and connection thereof to an electric charge amplifier, increases their sensitivity and/or the ratio of the signal which they deliver to noises of different origins (S/N).

The case will be considered of combinations of several sensors in series which does not change the gain obtained by the assembly but substantially increases the S/N ratio.

The combination of several sensors in parallel increases the sensitivity, as will be seen, but leaves practically unchanged the S/N ratio obtained. The method of the invention increases both the sensitivity of a parallel combination of a plurality of elementary sensors and the signal to noise ratio.

SUMMARY OF THE INVENTION

Method includes the use of a combination of several sensors each formed of a sensitive piezoelectric element associated with electrodes and the application of signals generated by the combination of sensors to an electric charge amplifier, having a feedback connected charge capacitor. In this method, the electric capacity of the combination of sensors at the input of the charge amplifier is reduced so as to reduce the amplification factor applied to the noise, without changing that which is applied to the signals, by connecting in successive cycles and in sequence a transfer capacitor of a capacity very much less than the capacity of the charge capacitor of the amplifier with the parallel combination of sensors, with the input of the amplifier, so as to transfer sequentially into said charge capacity the electric charges accumulated by the sensors, in response to forces which are applied thereto, and with the mass so as to discharge the transfer capacitor before any new connection to the sensors.

The device for putting this method into practice includes at least a combination of piezoelectric sensors connected in parallel, a charge amplifier associated with the charge capacitor, at least one charge capacitor and at least one electronic switch controlled by synchronizing means for connecting the terminal of each transfer capacitor sequentially with a combination of parallel sensors, with the input of said charge amplifier and with the mass.

The switch is actuated by control means, the frequency of the switching signal being chosen as a function of the width of the pass band useful for the signals provided by the sensors for filtering out frequencies higher than those contained in the pass band.

With the device then not only can the sensitivity and the signal to noise ratio be increased but, as will be seen, automatic low pass filtering is provided which is applied generally in all seismic signal acquisition chains.

BRIEF DESCRIPTION OF THE DRAWINGS

Other features of the method and the device for implementing same will be clear from reading the following description of embodiments given by way of non limitative examples, with reference to the acompanying drawings in which:

FIG. 1 shows schematically a piezo-electric sensor associated with a charge amplifier, FIG. 2 shows a series combination of sensors connected to the input of a charge amplifier, FIG. 3 shows a parallel combination of several sensors at the input terminals of the charge amplifier, FIG. 4 shows a first embodiment of the device for implementing the method, FIG. 5 shows a second embodiment of the device for implementing the method.

DESCRIPTION OF THE PREFERRED EMBODIMENTS

Figure 6:
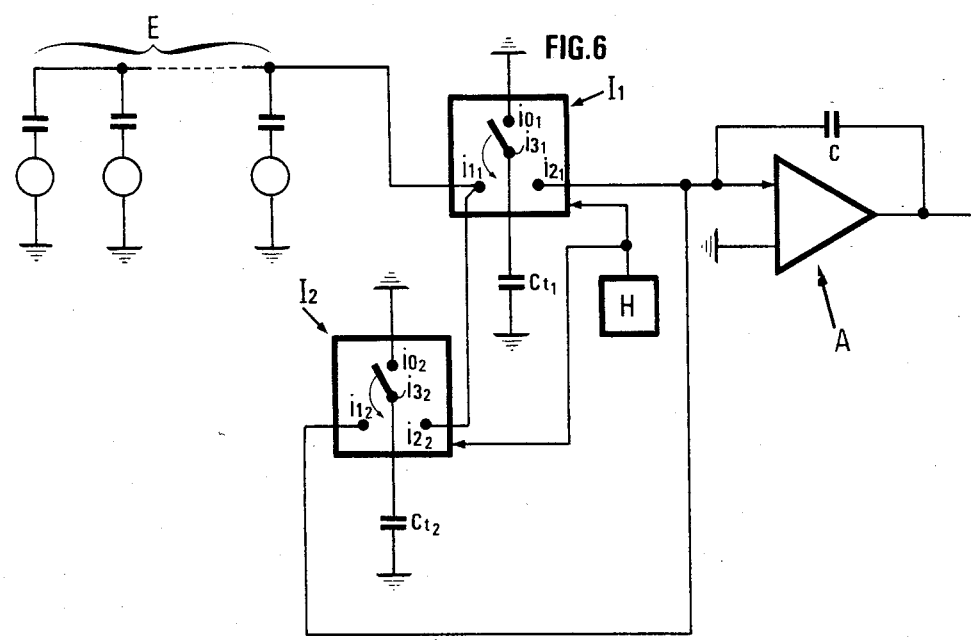
FIG. 6 shows a variant of the second embodiment of the device.

An elementary sensor formed of a flexible ribbon made from a material having piezo-electric properties associated with two electrodes is equivalent, from the electric point of view, to a voltage generator $V_i$ in series with a capacity $C_i$ (FIG. 1). This sensor is connected to an amplifier A with a charge capacitor of capacity C mounted for feedback.

From the electronic point of view, the amplifier is equivalent to a generator of voltage noise c applied to the input. It can be shown that the voltage gain $G_i$ obtained by amplifier A is equal to $-(C_i/C)$ and that the noise $B_S$ at the output is in the ratio $(1+(C_i/C))$ with the noise voltage c.

To increase the signal to noise ratio, elementary sensors can be combined in series or in parallel. The application to an amplifier A of a series combination of N elementary sensors of unitary capacity $C_i$ and each delivering a voltage $V_i$ produces a voltage gain identical to the preceding case ($G_V = -(C_i/C)$) but it can be observed that the noise $B_S$ at the output related to the noise voltage e at the input decreases as a function of the number n:

$$B_S/e = 1 + (C_i/nC)$$

In a series combination, only a fraction of the elementary electric charges is transferred into capacitor C.

If we apply to amplifier A the voltage delivered by a parallel combination of N elementary sensors of unitary capacity $C_i$ and each delivering a voltage $V_i$, it can be observed that the voltage gain is multiplied by n:

$$G = (V_S/V_i) = (nC_i/C)$$

but the noise increases with the number n of elementary sensors:

$$(B_S/e) = 1 + (nC_i/C)$$

The signal to noise ratio is therefore not substantially modified.

The method of the invention takes advantage of the increase in gain provided by the parallel combination and avoids the concomitant increase of noise. The decrease in the electric capacity of the combination of parallel sensors is obtained by inserting (FIG. 4) a transformer of impedance T whose transformation ratio is equal to the number n of sensors in the combination.

The gain provided by such a circuit is identical to the preceding one:

$$(V_S/V_i) = (nC_i/C)$$

but the noise $B_S$ at the output is reduced:

$$(B_S/e) = 1 + (C_i/nC)$$

and corresponds to the noise which is observed in a series circuit.

This first solution is advantageous for certain applications in which the number of combinations of sensors to be formed is relatively low, for the impedance transformers are both heavy and relatively expensive.

For some applications, particularly for the construction of marine seismic streamers in which:

the number of combinations of sensors used is very great, the density of integration of components in the streamer sheath is very high, the weights and the distribution thereof have important repercussions on the hydrodynamic balance during towing operations, the method of the invention may still be used in the following way.

The combination of parallel piezo-electric sensors is connected (FIG. 5) to a first input $i_1$ of a three position switch I. A second input $i_2$ of the switch is connected to the input of a charge amplifier A including a charge capacitor C. A third terminal $i_0$ is connected to the mass. The central terminal $i_3$ of switch I is connected to a capacitor $C_t$ whose capacity is very much less than that of the charge capacitor C.

A synchronization element H applies to switch I a control signal causing sequentially the electric connection of capacitor $C_t$ with the assembly of the piezo-electric sensors, with the input of amplifier A and with mass so as to provide a discontinuous series of electric charge transfers from the sensors to the charge capacitor C. Cyclic connection with the mass, when terminals $i_0$ and $i_3$ are interconnected, results in removing from the transfer capacitor $C_t$ the noise voltage generated by the amplifier.

By $C_g$ and Q are designated respectively the capacity and the electric charge of the assembly of parallel piezo-electric sensors. In a first step, capacitor $C_t$ receives from the assembly of sensors a charge;

$$q_{t1} = kQ \left( k = \frac{C_t}{C_t + C_g} \right)$$

which in the second step, by switching of switch I, is transferred into switch C where it develops a voltage:

$$V_S = -\frac{q_{t1}}{C}$$

or $$V_S = \frac{Q}{C} \cdot \frac{C_t}{C_g + C_t} = -k\frac{Q}{C}$$

During the second transfer cycle, a charge:

$$q_{t2} = \frac{C_t}{C_t + C_g}(Q - q_{tj})$$

which, using the same conventions, is again expressed by:

$$q_{t2} - k(1-k)Q$$

is first of all transferred into capacitor $C_t$ then into the charge capacitor C where it develops a voltage:

$$V_S = -k(1-k)\frac{Q}{C}$$

with the transfer cycles continuing, it can be shown that at the end of n transfers, the voltage $V_S$ accumulated in the capacitor C is:

$$V_S = \frac{Q}{C}[1 - (1-k)^n]$$

If the number n is large, the voltage $V_S$ then tends towards a limit:

$$V_{S(lim)} = -\frac{Q}{C}$$

Thus the complete transfer is achieved into the capacitor of amplifier A of the electric charge developed by the piezo-electric sensors of combination F.

It can be readily shown that the noise voltage generated after the successive switchings, is expressed by the relationship:

$$\frac{B_S}{e} = 1 + \frac{C_t}{2C}$$

Since the capacity $C_t$ is much smaller than C, the noise voltage is thus very much reduced and comparable to that which is observed with an impedance transformer.

The charge transfer takes place by successive transfers. The time required for these transfers is defined by its time constant $\tau$ and it can be shown that it is expressed by the relationship:

$$\tau = \frac{1}{F} \cdot \frac{1}{\log\frac{1}{k}}$$

Where F represents the frequency of the control signal of switch I. This relationship is valid in the particular case where the resistance of the switch is negligible.

In practice, when the switch has a certain impedance R, the time constant $\tau_R$ is expressed by the relationship $$\tau = \frac{1}{F} \cdot \frac{1}{\log\left[(1-k)\left(1 - \exp\frac{1}{FRkC_g}\right)\right]^{-1}}$$

It should be emphasized that, because of its time constant $\tau$, the device behaves like a low pass filter whose characteristics may be adjusted by suitably choosing the value of the capacity $C_t$ and the sampling frequency F. The pass band of the amplified signal may then be limited to the useful width. The device then automatically fulfills the function of antialiasing filter which in any case is included in every seismic data acquisition chain.

In the embodiment shown in FIG. 6, two transfer capacitors $C_{t1}$ and $C_{t2}$ are used connected respectively to the terminals $i_{31}$, $i_{32}$ of two switches $I_1$ and $I_2$.

The terminal $i_{11}$ and the terminal $i_{22}$ respectively of switches $I_1$ and $I_2$ are connected to the assembly E of piezo-electric sensors. The terminal $i_{21}$ and the terminal $i_{12}$ respectively of switches $I_1$ and $I_2$ are both connected to the input of amplifier A. The terminals $i_{01}$ and $i_{02}$ of the two switches are connected to the mass. The same synchronization element H controls the switching of switches $I_1$ and $I_2$. The central terminals $i_{31}$ and $i_{32}$ are successively connected, the first one to $i_{11}$, $i_{21}$ and $i_{01}$ and the second to $i_{12}$, $i_{22}$ and $i_{02}$.

Taking into account the interconnections provided, there is permanently a transfer capacitor $C_{t1}$ or $C_{t2}$ which receives charges from the assembly of sensors E while the other is discharging into the capacitor C of amplifier A.

Similarly, the residual noise voltages are removed in passing through terminals $i_{01}$ and $i_{02}$. Since amplifier A is charged during two thirds of each cycle by one of the two transfer capacitors $C_{t1}$ or $C_{t2}$, the noise level which is measured at the output is expressed by the relationship:

$$B_S = \frac{C_t}{2C}$$

where $C_t$ expresses the common capacity of the capacitors $C_{t1}$ and $C_{t2}$.

Figure 7:
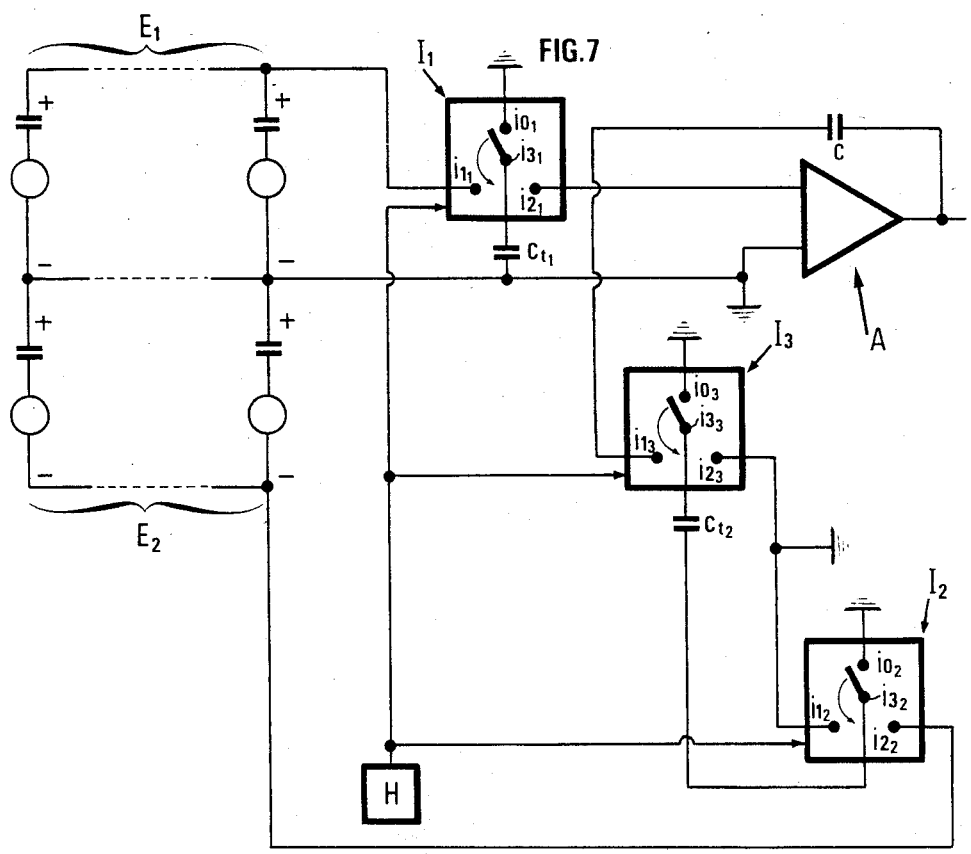
FIG. 7 shows another variant of the second embodiment, adapted to the amplification of charges produced by a series combination.

The variant shown in FIG. 7 relates to the adaptation of the transfer system to two charge capacitors, in the case where the sensor assembly includes two subassemblies $E_1$ and $E_2$ of piezo-electric sensors connected in series, the terminal common to the two subassemblies being connected to mass.

A first switch $I_1$ is adapted for connecting a first transfer capacitor $C_{t1}$ connected to its terminal $i_{31}$, either with a terminal $i_{11}$, which is connected to the positive terminal of the subassembly $E_1$, or with a terminal $i_{21}$ which is connected to the input of a charge amplifier A, or with the terminal $i_{01}$ which is connected to mass.

A second switch $I_2$ is adapted for connecting a first terminal of a second transfer capacitor $C_{t2}$ (which is connected to its central terminal $i_{32}$) either with a second terminal $i_{12}$ connected to mass, or with a negative terminal of the second subassembly $E_2$ which is connected to a second terminal $i_{22}$, or else with a third terminal $i_{32}$ connected to mass.

A third switch $I_3$ is adapted for connecting the other terminal of the second transfer capacitor $C_{t2}$ connected to its central terminal $i_{33}$, either with a first terminal $i_{13}$, which is connected to the input of amplifier A, or with a second terminal $i_{23}$ connected to mass, or with a third terminal $i_{03}$, also connected to mass.

The same synchronization element H controls simultaneously the switching of the three switches $I_1$, $I_2$ and $I_3$ at a switching frequency F.

Considering the connection mode used, the electric charge transfer from the first subassembly $E_1$ to the first transfer capacity $C_{t1}$, is accompanied by a transfer, into the capacitor C of amplifier A, of charges accumulated by the second transfer capacitor $C_{t2}$, the simultaneous switching of the three switches causing the symmetric operation, that in which the first charge capacitor $C_{t1}$ empties into the charge capacitor C and the second transfer capacitor accumulates charges taken from the second subassembly $E_2$.

A fraction of each cycle during which the central terminals $i_{31}$, $i_{32}$, $i_{33}$ of the three switches are connected respectively to the terminals $i_{01}$, $i_{02}$, $i_{03}$, is used for discharging, from the transfer capacitors $C_{t1}$, $C_{t2}$, the residual noise voltages.

In this embodiment, using the same amplifier, amplification is obtained of the charges accumulated in two groups of piezo-electric sensors of opposite polarities. Hereagain, the substantially permanent connection of a transfer capacitor $C_{t1}$ or $C_{t2}$ to the input of the amplifier avoids switching noise.

The intermittent short circuiting of the transfer capacitors produced by using three pole switches remains however an optional operation. Without departing from the scope of the invention two-position switches may be used in which the transfer capacitors are connected alternately to the sensors and to the input of the associated charge amplifier.

What is claimed is:

1. A device for improving sensitivity and signal to noise ratio of piezo-electric transducers including:
    at least one combination in parallel of piezo-electric sensors;
    at least one charge amplifier provided with a feedback circuit including a charge capacitor and with one input;
    at least one transfer capacitor of a capacity very much less than the capacity of said charge capacitor, said transfer capacitor being provided with a first terminal connected to ground and with a second terminal;
    at least one commutation means for connecting said second terminal to said combination of piezo-electric sensors to said input of the charge amplifier and to ground; and
    synchronizing means for controlling said commutation means whereby electric charges accumulated by said piezo-electric sensors are sequentially transferred to said charge capacitor and said charge capacitor is discharged to ground before any new connection of said second terminal to said piezoelectric sensors.

2. A device as claimed in claim 1, wherein said synchronization means includes a clock oscillator emitting a switching signal whose frequency is related to the width of the useful pass band of the signals received.

3. A device as claimed in claim 1 including two transfer capacitors provided respectively with a first terminal permanently connected with ground and respectively with a second terminal, two three-position commutation means connected respective second terminals of said two transfer capacitors in a first position to said piezo-electric sensors, in a second position to ground and in a third position to the input of said charge amplifier; and wherein said synchronizing means are connected for applying control signals to the commutation means whereby the second terminals of said two transfer capacitors are connected sequentially and alternately to said piezo-electric sensors for one and to the input of said charge amplifier for the other.

4. The device as claimed in claim 1, including two sub-assemblies of piezo-electric sensors of opposite polarities said two sub-assemblies being interconnected in series with their common terminals connected to ground, said device including first and second transfer capacitors provided respectively with first and second terminals, the first terminal of the first transfer capacitor being permanently connected to ground; and three commutation means, the first commutation means connected the second terminal of the first transfer capacitor in a first position to a first one of said two sub-assemblies, in a second position to ground and in a third position to the input of said charge amplifier, the second commutation means connecting the first terminal of said second transfer capacitor to ground in first and second positions and to said second sub-assembly of piezo-electric sensors, and the third commutation means connecting the second terminal of said second transfer capacitor to the input of said charge amplifier in a first position and to ground in a second position and a third position.

5. A method for improving sensitivity and signal to noise ratio of piezo-electric transducers including parallel connection of several sensors each formed of a sensitive piezo-electric substrate associated with electrodes and application of signals generated by said several sensors to an electric charge amplifier provided with a feedback circuit including a charge capacitor and with one input, said method comprising the steps of:
    providing a transfer capacitor having a capacity very much smaller than that of the charge capacitor;
    sequentially connecting said transfer capacitor with said several sensors connected in parallel, with the input of said charge amplifier and with ground, so as to discharge said transfer capacitor before any new connection to said several sensors in a cyclic fashion; and
    repeating transfer cycles of electric charges accumulated by the sensors in response to forces applied thereto into said charge capacitor, whereby electric capacity of said several sensors measurable at the input of the charge amplifier and amplification gain applied to the noise is reduced without changing the amplification gain which is applied to said signals.

* * * * *